United States Patent [19]

Platzer et al.

[11] Patent Number: 5,534,384
[45] Date of Patent: *Jul. 9, 1996

[54] PHOTOSENSITIVE MATERIAL FOR THE PRODUCTION OF A MULTICOLORED IMAGE

[75] Inventors: Stephan J. W. Platzer, Eltville/Erbach; Siegfried Nuernberger, Eltville/Martinsthal; Karin Maerz, Mainz, all of Germany

[73] Assignee: Hoechst Aktiengesellschaft, Frankfurt am Main, Germany

[*] Notice: The term of this paten shall not extend beyond the expiration date of Pat. No. 5,478,694.

[21] Appl. No.: 27,540

[22] Filed: Feb. 19, 1993

[30] Foreign Application Priority Data

Feb. 19, 1992 [DE] Germany .................. 42 04 950.4

[51] Int. Cl.⁶ .................. G03C 1/795; G03C 7/027; G03F 7/34
[52] U.S. Cl. .................. 430/260; 430/253; 430/254; 430/257; 430/262; 430/263; 430/273.1; 430/281.1; 430/288.1; 430/293
[58] Field of Search .................. 430/260, 263, 430/281.1, 288.1, 253, 254, 293, 257, 273.1, 262

[56] References Cited

U.S. PATENT DOCUMENTS

| | | | |
|---|---|---|---|
| 4,286,046 | 8/1981 | Cohen et al. | 430/293 |
| 4,666,817 | 5/1987 | Sachi | 430/293 |
| 4,876,172 | 10/1989 | Hillenbrand | 430/253 |
| 4,885,225 | 12/1989 | Heller et al. | 430/160 |
| 4,999,266 | 3/1991 | Platzer et al. | 430/257 |
| 5,049,476 | 9/1991 | Platzer | 430/293 |
| 5,176,973 | 1/1993 | Gifford et al. | 430/293 |
| 5,232,814 | 8/1993 | Graves et al. | 430/293 |
| 5,478,694 | 12/1995 | Maerz et al. | 430/257 |

FOREIGN PATENT DOCUMENTS 0339860  11/1989  European Pat. Off. .

*Primary Examiner*—John S. Y. Chu
*Attorney, Agent, or Firm*—Foley & Lardner

[57] ABSTRACT

A photosensitive material for the production of color proofing films for multicolor printing, having
  (A) a transparent, flexible film support of plastic,
  (B) a photopolymerizable layer which contains
    (B1) a polymeric binder,
    (B2) a free-radically polymerizable compound,
    (B3) a compound which is capable of initiating the polymerization of (B2) on exposure to actinic light, and
    (B4) a dye or a colored pigment in a primary color of multicolor printing, and
  (C) a thermoplastic adhesive layer having a layer weight of from about 2 to about 30 g/m² on the photo-sensitive layer, wherein the thermoplastic adhesive layer contains from about 0.01 to about 0.5% by weight of a colorless pigment having a mean particle size which corresponds to from 1 to 100% of the layer thickness.

The material is processed by lamination onto an image-receiving material, exposure of the material and peeling apart of film support and image-receiving material, leaving the unexposed layer areas on the image-receiving material together with the adhesive layer. To produce a multicolored image, these steps are repeated with at least one further single-color sheet. The material has higher stability against blocking during lamination and storage.

20 Claims, No Drawings

PHOTOSENSITIVE MATERIAL FOR THE PRODUCTION OF A MULTICOLORED IMAGE

BACKGROUND OF THE INVENTION

FIELD OF THE INVENTION

The invention relates to a photosensitive, in particular photopolymerizable, material for the production of color proofing films for controlling color separations which are used to expose printing plates for multicolor printing. It furthermore relates to a color proofing method in which a multicolored image comprising a plurality of single-color images in register is produced on an image-receiving material. The single-color images are produced by laminating a film support coated with a photopolymerizable layer which has been dyed in a primary color onto the image-receiving material, exposing the layer with the corresponding color separation, and developing the image by peeling off the support with the non-image areas from the image receiving material. A multicolored image is produced by repeating the same steps with photopolymerizable layers in other primary colors.

A color proofing method of this general type and a material intended for this purpose are disclosed in U.S. Pat. Nos. 4,895,787 and 5,049,476. This material comprises a transparent film support, the surface of which has preferably been adhesion-pretreated, a photopolymerizable layer which contains a dye or a colored pigment in a primary color of multicolor printing, and a heat-activatable adhesive layer on the photopolymerizable layer. The material is laminated onto an image-receiving material, exposed through the film support and then developed by peeling off the film support from the image-receiving material, leaving the exposed areas of the colored photosensitive layer on the film support, and the unexposed areas together with the adhesive layer on the image-receiving material. The method thus works positively, i.e., a positive copy of the original is produced on the image-receiving material.

This processing method has the advantage of not requiring any alkaline or acidic solutions or organic solvents for development; disposal of these is therefore unnecessary. A disadvantage of this method is that the thermoplastic adhesive layers have a certain tendency toward blocking when the material is stacked or wound up. This can result in the adhesive layer sticking so strongly to the back of the adjacent film on extended storage, in particular at elevated temperature, that it cannot be separated therefrom without damage. Moreover, when these films are laid one on top of the other during lamination, air can be trapped, which cannot be removed again due to the tendency of the layers to block or stick, and then results in faults during processing.

U.S. Pat. No. 4,889,787 describes a photo-sensitive material for the production of color proofing films based on photosensitive diazo oxides. The material has an adhesive layer which contains silica particles. The particles described therein are said to reduce the tendency of the adhesive layer toward blocking and accordingly have a mean particle size in excess of the layer thickness. This material is developed by washing out the non-image areas to give the image.

SUMMARY OF THE INVENTION

An object of the invention is to provide a photo-sensitive material and a color proofing method of the type described at the outset which has a reduced or no tendency towards sticking and the formation of air inclusions during lamination.

It is also an object of the present invention to provide a process for producing a multicolor proof as well as the produced color proofing film by use of such a photosensitive material.

In accomplishing the foregoing objectives, there has been provided, in accordance with one aspect of the present invention a photosensitive material for the production of color proofing films for multicolor printing, containing (A) a transparent, flexible plastics film support;

(B) a photopolymerizable layer which contains
 (B1) a polymeric binder,
 (B2) a free-radically polymerizable compound,
 (B3) a compound which is capable of initiating the polymerization of (B2) on exposure to actinic light, and
 (B4) a dye or a colored pigment in a primary color of multicolor printing; and (C) a thermoplastic heat-activatable adhesive layer having a layer weight of from about 2 to about 30 $g/m^2$ on the photopolymerizable layer, which thermoplastic layer contains from about 0.01 to about 0.5% by weight of a transparent, colorless pigment having a mean particle size which is from about 1 to 100% of the adhesive layer thickness.

In accordance with another aspect of the present invention, there is provided a process for the production of a multicolored proof comprising the steps of:

(a) laminating the above photosensitive material by means of the adhesive layer under pressure to an image-receiving material, (b) exposing the material imagewise through the film support with a color separation before or after the lamination, (c) peeling off the film support together with the exposed layer areas from the image-receiving material to give a first positive single-color image, and (d) repeating the steps (a)–(c) with at least one further color separation, the exposure being carried out in register with the first single-color image produced on the image-receiving material.

In accordance with another aspect of the present invention, there is provided a multicolored image produced by this method.

Further objects, features, and advantages of the present invention will become apparent from the detailed description of preferred embodiments that follows.

DETAILED DESCRIPTION OF PREFERRED EMBODIMENTS

A feature of the adhesive layer of the material according to the invention is that it contains a transparent, colorless pigment which has a particle size in a certain range and is present in an amount within a certain range. The pigment may be of inorganic or organic nature and must be insoluble in the coating solvents used for the adhesive layer. Since the solvent employed is preferably water or a mixture comprising predominantly water, a large number of water-insoluble substances are suitable as pigments. Examples include silica, aluminum oxides, silicates, phosphates, borates and other inorganic salts or oxides.

Also suitable are pigment particles of organic polymers, such as polyethylene, polypropylene, polyesters, polycarbonates, phenolic resins and other water-insoluble substances. In general, inorganic pigments are preferred. The pigment is generally present in an amount of from about 0.01 to about 0.5% by weight, based on the weight of the adhesive layer. Preference is given to amounts of from about 0.03 to about 0.3% by weight, in particular from about 0.03 to about 0.2% by weight.

The mean particle size of the pigment must be less than the layer thickness of the adhesive layer. The layer thickness is usually specified as the layer weight and is in the range from about 2 to about 30 g/m$^2$. For a density of 1, this corresponds to a thickness of from about 2 to about 30 µm. The mean particle size is therefore generally between about 0.02 and about 30 µm. Based on the layer thickness, the particle size is generally from about 1 to about 100%, preferably from about 10 to about 85% and particularly preferably from about 20 to about 70% of the layer thickness.

Particles having a size greater than the layer thickness cause visible holes and other damage to image areas of the underlying single-color image during lamination. Although it is generally regarded as necessary that particles in antiblocking layers exceed significantly the layer thickness in their environment, i.e., have a particle size considerably greater than the general layer thickness, the particles in the adhesive layers of the material according to the invention surprisingly also give the desired antiblocking effect even though their particle size is significantly less than the layer thickness.

The particles should be readily dispersible in the adhesive coating solutions, which can be aqueous. Any organic or inorganic pigments or combinations thereof meeting this condition can be used. Silica particles, in particular those without organic surface treatment, have proven particularly successful for this purpose.

The adhesive layer may comprise any desired components, so long as the adhesive effect is obtained. The adhesive layer can be applied in any desired manner, such as directly from a solvent or solvent mixture which does not dissolve the photopolymerizable layer, and then dried. It may also first be applied to a temporary film support and transferred therefrom to the photopolymerizable layer by lamination and peeling off of the temporary film support. Direct coating from solvents onto the photopolymerizable layer is preferred. Suitable solvents which do not dissolve the color layer are water and saturated hydrocarbons.

Many polymers of the adhesive layer can be applied from aqueous dispersion; however, application from solution is preferred. Examples of suitable polymers for this purpose are salts of polymers containing acid groups, for example, carboxyl groups. A preferred example is an aqueous-alkaline solution of a vinyl acetate-crotonic acid copolymer (Mowilith Ct 5). Other suitable polymers are polyvinyl acetate or polyacrylate dispersions. The polymer generally should have a softening point in the range from about 40° to about 200° C., preferably from about 60° to about 120° C., and should preferably have a Tg value in the range from about 20° to about 100° C.

In addition to the thermoplastic polymer, the adhesive layer may also contain plasticizers, residual solvents, surface-levelling agents, lubricants, anti-statics, optical brighteners and/or UV absorbers. The layer weight of the adhesive layer in the dry state is normally from about 2 to about 30 g/m$^2$, preferably from 4 to 15 g/m$^2$. Suitable adhesive layers are also described in U.S. Pat. No. 4,895,787, which is hereby incorporated by reference.

The photopolymerizable layer of the material according to the invention contains, as essential constituents, a polymeric binder, a free-radically polymerizable compound, a photoinitiator and a dye or colored pigment in a primary color of multicolor printing. Examples of photopolymerizable layers of this general composition are described in U.S. Pat. No. 4,895,787, which is hereby incorporated by reference in its entirety.

Suitable photoinitiators are essentially all the compounds or compound combinations known for this purpose. Examples include benzoin ethers, benzil ketals, polycyclic quinones, benzophenone derivatives, triarylimidazolyl dimers, and photosensitive trihalomethyl compounds, for example, trichloromethyl-s-triazines. Preference is given to 2,3-bisarylquinoxalines, as described in U.S. Pat. No. 3,765,898, and 2-aryl-4,6-bistrichloromethyl-s-triazines, as described in U.S. Pat. Nos. 3,987,037 and 4,189,323. The amount of photoinitiator or photoinitiator combination in the photopolymerizable layer can be varied depending on desired results and is generally between about 1 and about 25% by weight, preferably between about 5 and about 15% by weight.

The polymeric binder should provide the layer with homogeneity and strength. The binder can be any having these characteristics. Suitable binders include styrene-maleic anhydride and styrene-maleic acid monoester copolymers, acrylate polymers and copolymers, polyamides, polyvinylpyrrolidones, cellulose derivatives, such as cellulose esters and ethers, phenolic resins, polyvinyl esters, polyvinyl acetals, for example polyvinylbutyral, -propional or -formal. The amount of the binder in the photopolymerizable layer can be varied depending on desired results and is generally from about 15 to about 70% by weight, preferably from about 20 to about 50% by weight, based on the weight of the solid layer.

The polymerizable compound contains at least one, preferably at least two, terminal ethylenically unsaturated groups and is generally not gaseous at temperatures below 100° C. at atmospheric pressure. Any known polymerizable compound can be used. Preference is given to esters and amides of acrylic and methacrylic acid. Particular preference is given to esters with polyhydric alcohols. Examples are di-, tri-, tetra- and polyethylene glycol di(meth)acrylate, the di(meth)acrylates of oligo- and polypropylene glycols, 1,4-butanediol di(meth)acrylate, trimethylolpropane and trimethylolethane di- and tri(meth)acrylate, pentaerythritol tri- and tetraacrylate or -methacrylate, dipentaerythritol tetra-, penta- and hexa(meth)acrylate. The amount of polymerizable compound in the photopolymerizable layer can be varied depending on desired results and is generally from about 15 to about 70% by weight, preferably from about 20 to about 60% by weight.

The dyes or colored pigments are selected so that they correspond to the primary colors of multicolor printing; cyan, magenta, yellow and black. Any such pigments and/or dyes can be used. Pigments are generally preferred. Examples include Permanent Yellow G (C.I. 21 095), Permanent Yellow GR (C.I. 21 100), Permanent Yellow DHG (C. I. 21 090), Permanent Ruby L6B (C. I. 15 850: 1) , Permanent Pink F3B (C.I. 12 433), Hostaperm Pink E (C.I. 73 915), Hostaperm Red-Violet ER (C.I. 46 500), Permanent Carmine FBB (C.I. 12 485), Hostaperm Blue B2G (C.I. 74 160), Hostaperm Blue A2R (C.I. 74 160) and Printex® 25 (carbon black). The pigments can, if desired, be blended in order to achieve the desired hue. The inorganic or organic pigments are generally dispersed or slurried in a suitable solvent together with some of the binder. The mean particle size is generally less than about 1 µm.

The amount of the dye or pigment in the photopolymerizable layer can be varied to obtain the desired color density and is generally from about 8 to about 40% by weight, preferably from about 12 to about 30% by weight.

The photopolymerizable layer may, if desired, contain further constituents, such as hydrogen donors, sensitizers, polymerization inhibitors, plasticizers, residual solvents, surfactants, surface-levelling agents, lubricants, antistatics, inert fillers, optical brighteners and/or UV absorbers.

The photopolymerizable layer generally has a layer weight of from about 0.2 to about 5 g/m$^2$, preferably from about 0.3 to about 3 g/m$^2$.

The film supports employed are transparent, flexible, dimensionally-stable films made from plastics. Any plastic having these characteristics can be used, for example, polyesters, polycarbonates, and the like. Particular preference is given to polyester films, in particular biaxially-stretched and thermofixed films, for example made from polyethylene terephthalate. These should be dimensionally stable at the lamination temperatures necessary, i.e., at temperatures between about 60° and about 150° C. Their thickness is generally from about 10 to about 200 μm, preferably from about 25 to about 80 μm. The film support is advantageously adhesion-pretreated on one or both sides and may have a smooth or a rough or matte surface, a smooth surface being preferred.

In order to carry out the process according to the invention, the above-described photosensitive material is laminated by means of the adhesive layer onto an image-receiving material. The latter can comprise plastic, plastic-coated special paper or normal printing paper. Other white or, if desired, non-white receiving materials can likewise be used. A printing paper which retains its dimensions under the laminating conditions is usually preferred since this allows a visual impression very close to the later image to be achieved. A method of using such printing paper is described in U.S. Pat. No. 4,910,120, which is included herein by reference.

The lamination is expediently carried out in equipment provided for this purpose under pressure and, preferably, at elevated temperature. The lamination temperature is usually in the range from about 60° to about 130° C, preferably between about 70° and about 100° C. Before or preferably after the lamination, the photopolymerizable layer is exposed imagewise in a known manner through the film support, generally in contact with a positive color separation film. After the exposure, the film support is peeled off by hand or in a suitable device. The peel angle should be at least 90°, an angle of 180° being particularly preferred. The exposed areas of the photopolymerizable layer are removed with the film support, while the unexposed areas remain on the image-receiving material together with the adhesive layer. In this way, a positive single-color image is obtained.

To obtain a multicolored image each further color proofing film is laminated onto the previous single-color image in the manner described, exposed thereon in register and developed by peeling off the film support. In this way, a full multicolored proof which corresponds to the later 4-color image is produced from the single-color images in the colors cyan, magenta, yellow and black. If required, it is of course also possible to employ color proofing films in other colors.

The finished multicolored proof has a glossy surface. If desired, the surface can be rendered matte by, for example, laminating a film having a rough texture onto the glossy layer surface and peeling it off again.

The surface of the finished proof can be protected against scratching or blocking at elevated temperatures by means of a protective layer.

The invention is described by means of the Examples below. All percentages and amount ratios are given in units by weight.

EXAMPLE 1

Coating solutions of the following composition were applied to biaxially stretched and thermofixed polyethylene terephthalate films with a thickness of 50 μm which had been pretreated on both sides (Melinex® 454) in order to improve the adhesion, and the coatings were dried:

| Constituent | Parts by weight | | | |
| --- | --- | --- | --- | --- |
|  | Cyan | Magenta | Yellow | Black |
| Dipentaerythritol penta-acrylate | 39.0 | 35.5 | 38.2 | 36.1 |
| Polyvinylformal (Formvar® 12/85) | 31.3 | 36.5 | 35.4 | 28.9 |
| 2-Biphenyl-4-yl-4,6-bistrichloro-methyl-s-triazine | 9.8 | 7.8 | 9.5 | 9.6 |
| Hostaperm Blue B2G (C.I. 74160) | 19.0 | — | — | — |
| Permanent Carmine FBB (C.I. 12485) | — | 18.5 | — | — |
| Permanent Yellow GR (C.I. 21100) | — | 0.7 | 16.4 | — |
| Carbon Black (Printex® 25) | 0.4 | 0.5 | — | 24.8 |
| Silicone oil as flow-control agent (Edaplan® La 411) | 0.5 | 0.5 | 0.5 | 0.6 |
| Tetrahydrofuran | 1000 | 1000 | 1000 | 1000 |
| 1-Methoxypropan-2-ol | 680 | 680 | 680 | 680 |
| Butyrolactone | 190 | 190 | 190 | 190 |

The colored pigments were first dispersed in a solution of some of the polyvinylformal in butyrolactone and ground to give a mean particle size of less than 0.2 μm. The dry layer weight of the four films was as follows:

| | |
| --- | --- |
| Cyan | 0.58 g/m$^2$ |
| Magenta | 0.83 g/m$^2$ |
| Yellow | 0.75 g/m$^2$ |
| Black | 0.67 g/m$^2$ |

In each case, the photosensitive layer was coated with an adhesive layer solution of

| | |
| --- | --- |
| 96.57 | parts of vinyl acetate-crotonic acid copolymer (95:5) |
| 1.93 | parts of polyvinyl methyl ether, |
| 1.36 | parts of sodium sulfite and |
| 0.15 | parts of pyrogenic silicic acid, mean particle size 3 μm (Syloid® ED 3) in |
| 520 | parts of water, |
| 43 | parts of ethanol and |
| 8.5 | parts of aqueous ammonia (25% strength), | and dried to give a layer weight of 6.5 g/m$^2$.

The photosensitive color proofing films obtained did not block when stored for 24 hours at 50° C. with adhesive layer against film back or with adhesive layer against adhesive layer. After 5 days at 50° C., the films stored with adhesive layer against adhesive layer began to block, while those stored with adhesive layer against film back still showed no evidence of blocking.

The cyan film was laminated with the adhesive layer onto a receiving sheet of paper in a device having a heated pair of rolls at 85° C. and was exposed through the film support under a cyan color separation. The film support was then peeled off from the receiving sheet, the unexposed areas of the layer remaining on the receiving sheet together with the adhesive layer. In the same way, the magenta, yellow and black films were laminated successively onto the receiving sheet on top of the previous single-color image, exposed in register under the corresponding color separation film and developed by peeling off the film support. During lamination of each successive color proofing film onto the previous single-color image, no air inclusions were formed since the adhesive layer of the new film did not block with the single-color image before reaching the roller nip. In this way, a four-color proof corresponding to the original master was obtained on the receiving sheet. The resolution—irrespective of the peel-off direction of the film support—was at least 15 μm. In a 60 line/cm screen, the dots were reproduced from 2 to 98%.

COMPARATIVE EXAMPLE A

Example 1 was repeated, but the silica pigment was omitted from the adhesive layer. The color proofing films obtained blocked when stored for 15 minutes at 50° C. either adhesive layer against adhesive layer or adhesive layer against film back. During lamination of the next color proofing film onto the receiving sheet with the previously processed image, air inclusions were formed since the layers had already stuck to one another before reaching the roller nip.

COMPARATIVE EXAMPLE A

Comparative Example A was repeated, but the polyester films (Melinex® 454) coated on both sides with adhesion promoter were replaced by polyester films (Melinex® 6057) coated on one side with an adhesion promoter and on the other side with an antiblocking layer. The photosensitive layers were applied to the side coated with adhesion promoter. The color proofing films obtained blocked when stored for 15 minutes at 50° C. with adhesion layer against adhesion layer or when stored for 1 hour at 50° C. with adhesion layer against film back. As in Comparative Example A, air inclusions were formed during lamination.

COMPARATIVE EXAMPLE C

Color proofing films were produced as described in Example 1, but the silica particles in the adhesive layer were replaced by corresponding particles having a mean particle size of 9 μm (Syloid® 621). The layer weight of the adhesive layer was again 6.5 g/m². The color proofing films did not block when stored for more than 24 hours at 50° C. with adhesive layer against adhesive layer. No air inclusions were formed during lamination; however, small holes were torn in the image elements of the single-color image produced previously, caused by the large particles of the adhesive layer applied thereto.

COMPARATIVE EXAMPLE D

The procedure was as in Comparative Example C, but the silica pigment was replaced by a corresponding pigment having a mean particle size of 0.04 μm (Aerosil® 0X50). The color proofing films blocked after 30 minutes at 50° C. when stored with adhesive layer against adhesive layer, and after 1 hour when stored with adhesive layer against film back. During lamination, some air inclusions formed.

EXAMPLE 2

The procedure was as in Example 1, but adhesive layers having a layer weight of 10.5 g/m² were applied. The color proofing films did not block when stored for more than 24 hours at 50° C. with adhesive layer against adhesive layer or with adhesive layer against film back. No air inclusions or holes were observed in the image areas during lamination.

EXAMPLE 3

The procedure was as in Example 1, but the amount of polyvinyl ether in the adhesive layer was increased. The composition of this layer was as follows:

| | |
|---|---|
| 93.86 | parts of vinyl acetate copolymer, |
| 4.69 | parts of polyvinyl methyl ether, |
| 1.31 | parts of sodium sulfite and |
| 0.14 | part of Syloid ® ED3 |

The layer weight was 6.5 g/m². The color proofing films obtained did not block when stored for more than 24 hours at 50° C. with adhesive layer against adhesive layer or with adhesive layer against film back. No air inclusions or holes were observed in the image areas of the single-color images after lamination.

EXAMPLE 4

In this Example, the receiving sheet employed was a rough paper carrying a precoating of polyvinyl acetate (Mowilith® 20) of 17 g/m². Receiving sheets with a corresponding precoating are described in U.S. Pat. No. 4,910,120.

Color proofing films of the same composition as in Example 1 were produced. In this Example, however, the black film was first laminated onto the precoated side of the receiving sheet. This film was followed by the magenta film, then by the yellow film and finally by the cyan film. Processing by exposure and peeling-off of the film supports were carried out as in Example 1. The multicolored image obtained was a true reproduction of the original.

COMPARATIVE EXAMPLE E

Example 4 was repeated, but the silica pigment was omitted from the adhesive layer. The color proofing films obtained blocked after storage for 15 minutes at 50° C. with adhesive layer against adhesive layer or with adhesive layer against film back. After lamination, no holes were evident in the multi-colored proofs, but air inclusions were observed.

EXAMPLE 5

The procedure was as in Example 1, but in each case the silica pigment in the adhesive layer was replaced by the same amount of a mixture of 42 parts by weight of silica and 36 parts by weight of aluminum oxide having a mean particle size of 3.5 μm. The color proofing films obtained did not block when stored for more than 24 hours at 50° C. with adhesive layer against adhesive layer or with adhesive layer against film back. No holes in the image elements or air inclusions were observed.

What is claimed is:

1. A photosensitive material for the production of color proofing films for multicolor printing suitable for developing by a peel-apart development process, comprising:

(A) a transparent, flexible plastic support film, (B) a photopolymerizable layer which comprises:
(B1) a polymeric binder,
(B2) a free-radically polymerizable compound,
(B3) a compound which is capable of initiating the polymerization of (B2) on exposure to actinic light, and
(B4) a dye or a colored pigment in a primary color of multicolor printing, and
(C) a thermoplastic heat-activatable adhesive layer having a layer weight of from about 2 to about 30 $g/m^2$ on the photopolymerizable layer, which thermoplastic layer comprises from about 0.01 to about 0.5% by weight of a transparent, colorless pigment having a mean particle size of from about 1 to less than 100% of the adhesive layer thickness,
wherein said photopolymerizable layer exhibits an adhesion change upon development, such that in exposed areas said photopolymerizable layer adheres more strongly to said support film, and in unexposed areas said photopolymerizable layer adheres more strongly to said adhesive layer.

2. A photosensitive material as claimed in claim 1, wherein the colorless pigment is an organic pigment.

3. A photosensitive material as claimed in claim 1, wherein the mean particle size corresponds to from about 10 to about 85% of the adhesive layer thickness.

4. A photosensitive material as claimed in claim 1, wherein the colorless pigment is an inorganic pigment.

5. A photosensitive material as claimed in claim 1, wherein the thermoplastic adhesive layer contains from about 0.03 to about 0.3% of pigment.

6. A photosensitive material as claimed in claim 1, wherein the colorless pigment is silica.

7. A photosensitive material as claimed in claim 1, wherein the photopolymerizable layer contains from about 15 to about 75% by weight of the binder (B1), from about 15 to about 70% by weight of polymerizable compound (B2), from about 1 to about 25% by weight of (B3), and from about 8 to about 40% by weight of (B4).

8. A photosensitive material as claimed in claim 1, wherein the thermoplastic adhesive layer has a glass transition temperature of from about 20° to about 100° C.

9. A photosensitive material as claimed in claim 1, wherein the free-radically polymerizable compound (B2) contains at least two terminal ethylenically unsaturated groups.

10. A photosensitive material as claimed in claim 1, wherein the free-radically polymerizable compound (B2) is an acrylic or methacrylic acid ester.

11. A photosensitive material as claimed in claim 1, wherein the photopolymerizable layer has a weight of from about 0.2 to about 5 $g/m^2$.

12. A photosensitive material as claimed in claim 1, wherein (B4) is an inorganic or organic pigment having a mean particle size of less than about one micrometer.

13. A photosensitive material as claimed in claim 1, wherein the film support (A) is a polyester film.

14. A photosensitive material as claimed in claim 13, wherein the polyester film is biaxially stretched and heat-set polyethylene terephthalate.

15. A photosensitive material as claimed in claim 3, wherein the mean particle size corresponds to from about 20% to about 70% of the adhesive layer thickness.

16. A photosensitive material as claimed in claim 4, wherein said pigment is selected from the group consisting of silica, aluminum oxides, silicates, phosphates and borates.

17. A photosensitive material as claimed in claim 5, wherein the thermoplastic adhesive layer comprises from about 0.03 to about 0.2% by weight of pigment.

18. A photosensitive material as claimed in claim 1, wherein said photoinitiator compound (B3) is selected from the group consisting of 2,3-bisarylquinoxalines and 2-aryl-4,6-bistrichloromethyl-s-triazines.

19. A photosensitive material as claimed in claim 1, wherein said photopolymerizable layer further comprises one or more constituents selected from the group consisting of hydrogen donors, sensitizers, polymerization inhibitors, plasticizers, residual solvents, surfactants, surface-levelling agents, lubricants, antistatics, inert fillers, optical brighteners and UV absorbers.

20. A photosensitive material as claimed in claim 1, wherein said adhesive layer further comprises one or more constituents selected from the group consisting of plasticizers, residual solvents, surface-levelling agents, lubricants, antistatics, optical brighteners and UV absorbers.

* * * * *